United States Patent [19]

Dennis et al.

[11] Patent Number: 5,333,375
[45] Date of Patent: Aug. 2, 1994

[54] SUBSTRATE LEAD STRIP MOUNTING MACHINE AND METHOD

[75] Inventors: Richard K. Dennis, Etters; Wade D. Myers, York; James A. Riddle, Red Lion, all of Pa.

[73] Assignee: Die Tech, Inc., York Haven, Pa.

[21] Appl. No.: 122,389

[22] Filed: Sep. 16, 1993

[51] Int. Cl.⁵ .................. H01R 43/00; B23P 23/00
[52] U.S. Cl. ............................ 29/827; 29/564.1; 29/564.6; 29/759; 174/52.4; 437/206
[58] Field of Search ............. 29/827, 759, 564.1, 29/564.6, 884; 437/206, 220

[56] References Cited

U.S. PATENT DOCUMENTS

| | | | |
|---|---|---|---|
| 3,529,073 | 9/1970 | Leonard | 437/206 X |
| 3,777,365 | 12/1973 | Unnbough | 437/206 |
| 4,015,322 | 4/1977 | Cabaud | 29/739 |
| 4,270,267 | 6/1981 | Bakermans | 29/881 |
| 4,477,969 | 10/1984 | Cabaud | 29/739 |
| 4,599,037 | 7/1986 | Ross, Jr. et al. | 414/752 |
| 4,651,415 | 3/1987 | Frampton | 29/827 |
| 4,653,174 | 3/1987 | Gilder, Jr. et al. | 29/827 X |
| 4,766,478 | 8/1988 | Dennis | 357/70 |
| 4,782,589 | 11/1988 | Dennis | 29/759 X |
| 4,816,427 | 3/1989 | Dennis | 437/209 |
| 4,820,658 | 4/1989 | Gilder, Jr. et al. | 29/827 X |
| 4,872,260 | 10/1989 | Johnson et al. | 29/827 |
| 5,071,712 | 12/1991 | Frampton | 174/52.4 X |
| 5,136,779 | 8/1992 | Abel et al. | 29/827 |

OTHER PUBLICATIONS

Drawing Showing Die Tech, Inc. Single Strip Machine, Jan. 4, 1994.
Photograph of Single Strip Machine.
Photograph of Double Strip Machine.

*Primary Examiner*—Carl J. Arbes
*Attorney, Agent, or Firm*—Thomas Hooker

[57] ABSTRACT

An apparatus and method for simultaneously mounting lead strip segments onto each side of a rectangular ceramic substrate. Four lead strip mounting assemblies are equally spaced 90 degrees apart around a central vertically oriented substrate support so that each assembly is perpendicular an edge of a substrate on the support. Lead strip feed assemblies located adjacent each mounting assemblies cuts lead strip segments and feeds the lead strip segments into the mounting assemblies. The four mounting assemblies simultaneously mount the lead strip segments on the substrate.

49 Claims, 15 Drawing Sheets

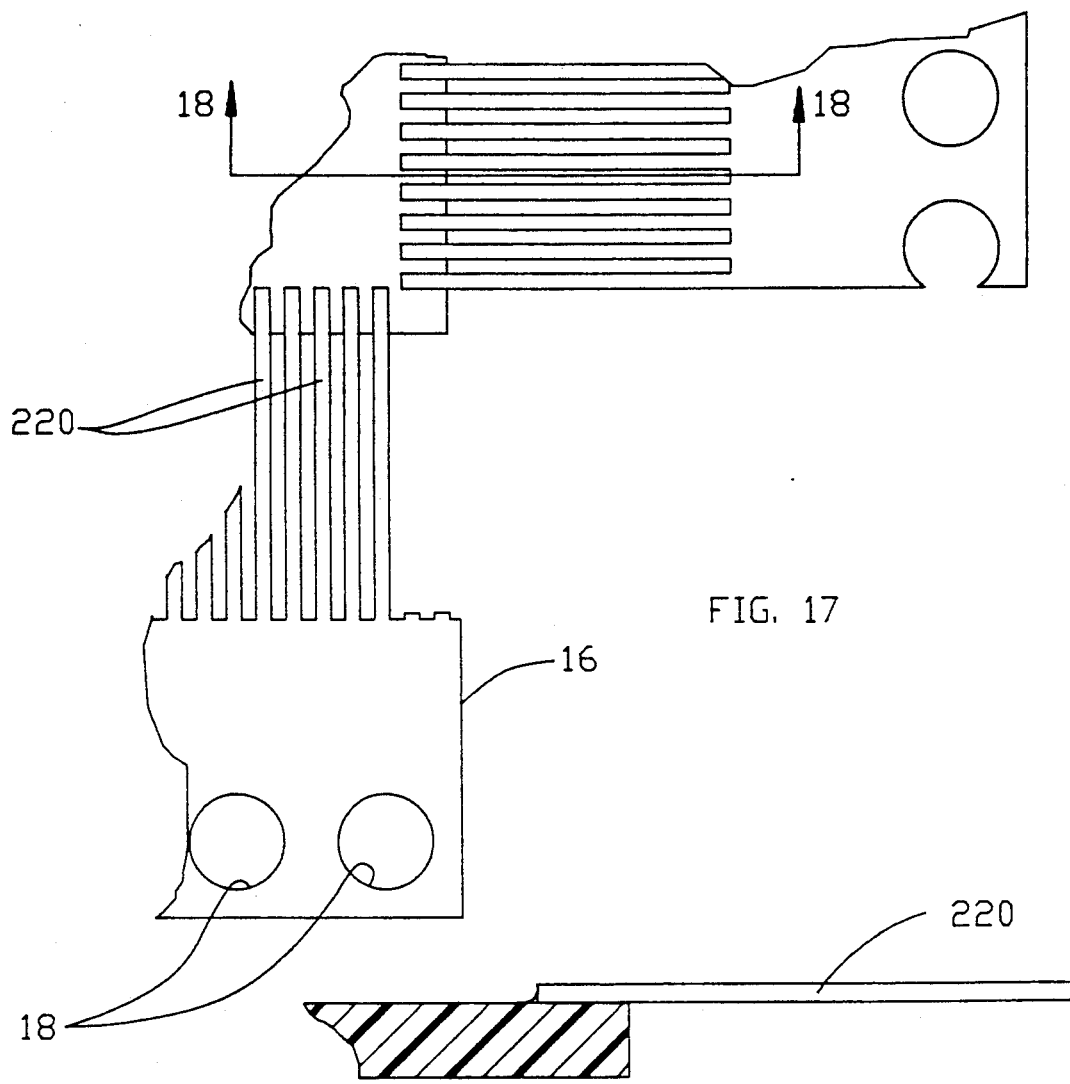

SUBSTRATE LEAD STRIP MOUNTING MACHINE AND METHOD

FIELD OF THE INVENTION

The invention relates to a machine and method for mounting lead strips onto the edges of an integrated circuit substrate, typically a ceramic substrate.

DESCRIPTION OF THE PRIOR ART

Ceramic substrates with integrated circuits are mounted on printed circuit boards by thin metal leads. One end of each lead is physically mounted onto a circuit pad on an edge of the substrate and then soldered to the pad. The opposite end of each lead is bonded to the printed circuit board.

Leads are mounted onto the edges of the substrate before the substrate chip is bonded to the circuit board. Conventional lead strip mounting machines mount leads onto the edges of the substrate in lead strip segments. Each segment has a plurality of parallel leads having a spacing equal to the spacing of the substrate pads. The leads align with the substrate pads as the lead strip segment is mounted onto the edge of the substrate.

A conventional mounting machine mounts a lead strip segment onto the edges of a substrate one edge at a time. A first lead strip segment is mounted on one edge of a substrate. The substrate with the mounted lead strip segment or the mounting machine are then moved so that additional lead strips may be mounted on other edges of the substrate. The mounting process is repeated until the required number of lead strip segments are mounted onto the substrate. Often, lead strip segments are required to be mounted on the four sides of a rectangular substrate. Mounting strip segments one strip at a time is slow and requires use of a number of machines in order to achieve high production rates.

Another conventional mounting machine feeds a spaced pair of lead strips along opposed sides of a substrate and then moves the ends of the lead strips together to mount the leads on the strips on opposed edges of the substrate. The mounted strip segments are severed from the lead strips. This machine cannot mount lead strips on all four sides of a rectangular substrate.

Through the years, the number of consumer products which incorporate integrated circuit technology in the product design has increased significantly. The increased utilization of substrates with loaded integrated circuitry necessitates increased production rates requiring lead strips be mounted onto the edges of a substrate at a rate greater than currently possible using conventional lead strip mounting machines.

SUMMARY OF THE INVENTION

The disclosed invention is a machine and method for rapidly and accurately mounting lead strip segments simultaneously on each edge of a rectangular ceramic substrate. The machine includes four mounting assemblies which are equally spaced 90 degrees apart around a central support member located on a vertical axis. The mounting assemblies are each located adjacent an edge of the substrate held on the support member. Each mounting assembly includes a lead strip transport head and a lead strip cut off and feed device. The head is slidable in synchronization with the other transport heads toward and away from the central axis by a piston-actuated cam drive. The lead strip cut-off and feed device is located adjacent each head. Each lead strip feed and cut-off device cuts a lead strip segment from the end of a lead strip supply reel and feeds the segment into the adjacent transport head so that each lead of the lead strip segment is aligned with a substrate pad located along the adjacent edge of the substrate. Each transport head clamps the segment into aligned position for mounting on substrate pads after the head moves toward the substrate.

A cam drive moves each transport head supporting a lead strip segment toward the adjacent edge of the substrate until the clip end of each lead is force fitted onto the edge of the substrate forming a positive connection with the substrate pad. The lead strip segments are released from the heads and the transport heads are then simultaneously moved away from the central axis by the cam drive, leaving the lead strip segments mounted to the edges of the substrate. The individual leads in the segments are soldered to the pads in a subsequent operation.

The machine is particularly useful in mounting lead strip segments with closely spaced leads on closely spaced contact pads extending along the edges of very small substrates. For instance, the machine may be used to simultaneously mount four lead strip segments each having a total of 52 leads on the edges of a square ceramic integrated circuit substrate having an edge length of slightly more than 1.1 inch. The individual leads have a center-to-center spacing of about 0.02 inch and a width of approximately 0.01 inch with a gap between adjacent leads of about 0.01 inch. Contact pads are spaced along the edge of the substrate at a center-to-center spacing of 0.02 inch. The width of the pads is equal to the width of the leads or about 0.01 inch.

The disclosed machine simultaneously mounts lead segments on all four sides of the substrate with the ends of individual leads pads overlapping the pads spaced along the substrate edges. The leads need not be in exact alignment with the substrate pads. Each lead must overlap its proper pad about 75 percent of the width of the pad in order to assure subsequent formation of a reliable solder connection between the lead and the pad. Further, the opposed leads extending from lead strip segments on opposite sides of the substrate are in axial alignment with each other, thereby assuring that the lead ends extending outwardly from the edges of the substrate, after soldering and removal of the carrier strips, are in proper alignment for forming electrical connections with opposed rows of aligned contacts on a circuit board or mounting member receiving the substrate. The very accurate location of opposed lead strip segments in the machine prior to mounting on the substrate assures that the ends of the leads engaging the substrate edge are in proper overlapping alignment with the pads on the substrate and that opposed leads on the opposite sides of the substrate are in proper axial alignment for forming electrical connections between the ends of the leads remote from the substrate and a board or mounting member.

In addition to mounting clip leads on a substrate, the machine may also be used to mount leads having flat contact ends to the edges of a rectangular ceramic substrate. When flat leads are mounted to the edges of the substrate, the substrate support is initially displaced vertically downward. The flat leads are then moved perpendicularly toward the substrate to a location above the substrate edges with each lead vertically aligned above a substrate pad. The substrate support is then moved up until each substrate pad contacts a flat lead. The lead strip segments are supported by the transport heads until a solder connection is formed between each lead flat end and substrate pad.

Other objects and features of the invention will become apparent as the description proceeds, especially when taken in conjunction with the accompanying drawings illustrating the invention, of which there are 15 sheets and two embodiments.

DESCRIPTION OF THE DRAWINGS

FIG. 17 is a top view, partially broken away, showing flat leads prior to mounting the leads onto the edges of a substrate;

FIG. 18 is a sectional view taken along line 18—18 of FIG. 17; and

FIG. 19 is a sectional view like FIG. 18, showing a flat lead mounted onto the edge of the substrate.

DESCRIPTION OF THE PREFERRED EMBODIMENT

Figure 1:
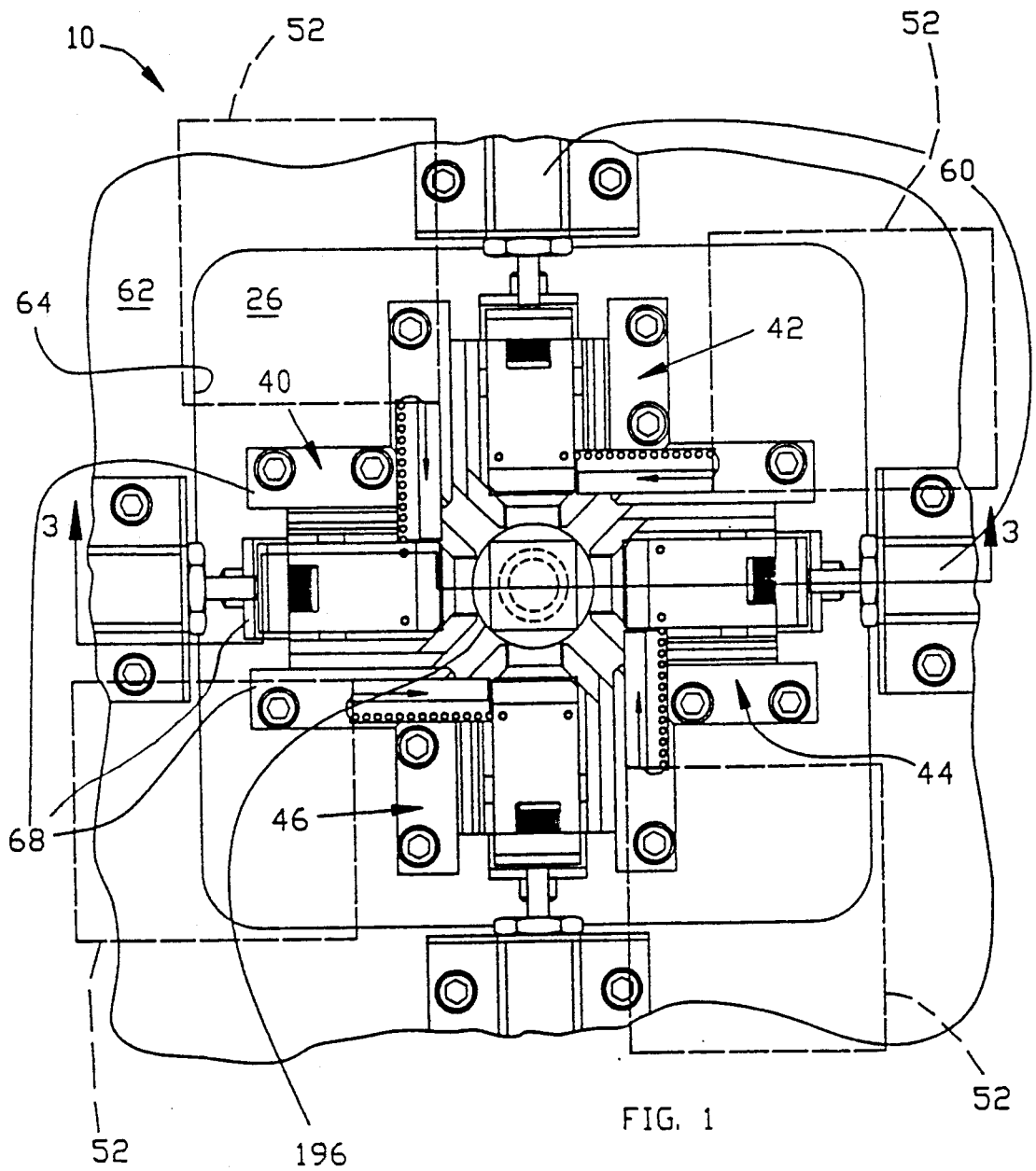
FIG. 1 is a top view of the mounting machine showing four lead strip mounting assemblies in a first position for receiving a lead strip.
Figure 2:
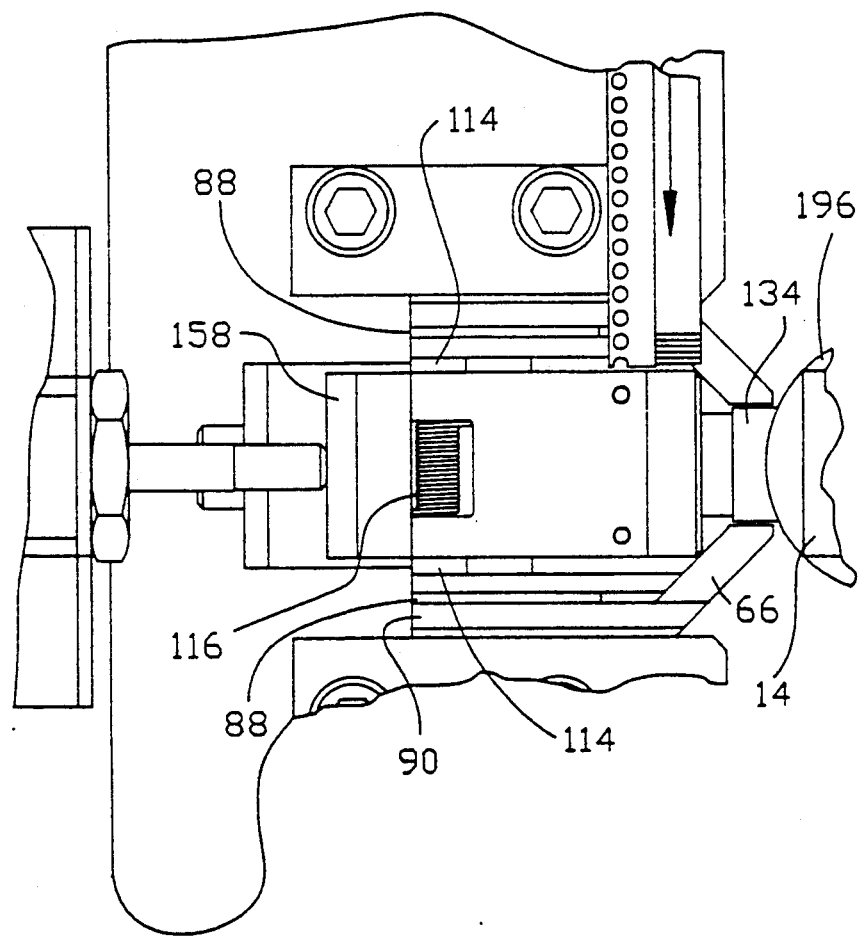
FIG. 2 is an enlarged view of a portion of FIG. 1.

Lead strip mounting machine 10 is used to mount lead strip segments 12 simultaneously onto each edge of a rectangular integrated circuit ceramic substrate 14.

Each lead strip segment 12 is cut from an end of an indefinite length strip 16 with a carrier strip 16 with regularly spaced pilot holes 18 formed along the length of the strip. A plurality of spaced parallel leads 20 extend to one side of the carrier strip. Each lead includes a C-shaped clip 22 integral the end of the lead for gripping an edge of substrate 14.

Regularly spaced metallic contact pads 24 are subsequently bonded to the top of substrate 14 along each edge of the substrate. The spacing of the pads is equal the spacing of the leads.

Figure 3:
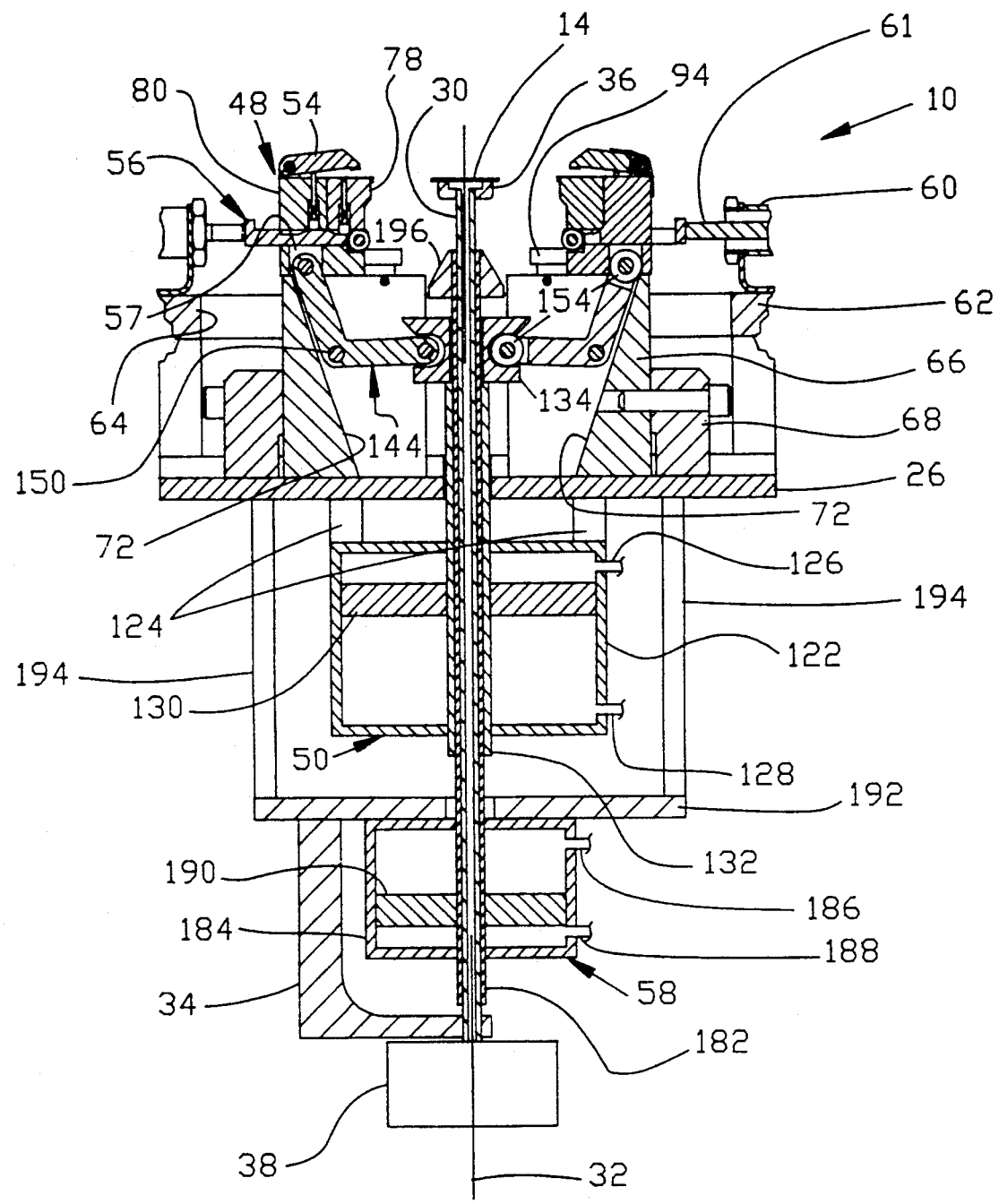
FIG. 3 is a sectional view taken generally along section line 3—3 of FIG. 1.

Machine 10 is mounted on base plate 26. Vacuum support tube 30 extends vertically on machine axis 32 through opening 28 in the plate. The tube is held in place by bracket 34 as shown in FIG. 3. A hollow circumferential substrate support pad 36 is mounted on the top of the vacuum tube. A substrate 14 is accurately located on the support pad and removed from the pad by a conventional pick and place device (not shown). After the substrate is located on the pad, the substrate is held in place on the pad by vacuum or reduced pressure provided by a vacuum source 38 connected to the lower end of the vacuum tube 30. The vacuum holds the substrate tightly on to the edge of the substrate pad in accurate location to facilitate mounting of leads 20 on pads 24. The vacuum is applied during mounting of the leads onto the edges of the substrate. After mounting the vacuum is released to permit free removal of the substrate from the support pad.

Four like separate lead strip mounting assemblies 40, 42, 44, and 46 are located on top of the base plate, and are equally spaced around the central vertical axis 32, 90 degrees apart so that each assembly is adjacent an edge of ceramic substrate 14 when the substrate is held in place on the substrate support pad.

Each mounting assembly has a lead strip transport head 48 movable linearly by central drive 50 in synchronization with the other transport heads toward and away from the substrate, perpendicular to the adjacent substrate edge, and a lead strip feed and cut off assembly 52 which may be of conventional design.

As shown in FIG. 1, each lead strip feed and cut off assembly 52 is located to one side of a transport head. Assembly 52 cuts a lead strip segment 12 fed from the end of a lead strip supply reel (not illustrated) and feeds the segment into a lead strip transport head so that each lead of the strip segment 12 is approximately aligned with the pad 24 on the substrate edge adjacent the respective mounting assembly to which the lead will be mounted by machine 10. Each feed and cut off assembly is located in a recess between adjacent heads 48.

A clamp plate 54 is located on the top of each strip transport head 48 and is rotatable between an open position permitting a lead strip segment to be fed onto the transport head, and a lowered clamping position on top of the lead strip segment. The plate holds the segment in place on the transport head during movement of the head toward ceramic substrate 14 and loading.

Each mounting assembly includes a slide cam 56, movable in slot 57 in transport head 48 toward and away from the axis 32. Drive 58 simultaneously moves each slide cam outward away from the axis. Each slide cam is moved toward central vertical axis 32 by a pneumatic cylinder 60 located outwardly of each mounting assembly on top plate 62. Opening 64 in the top plate surrounds four alignment blocks 66 which support the mounting assemblies on plate 26. The operation of the cylinders 60 is synchronized so that the slide cams are pushed in simultaneously. Drive 58 moves the slide cams simultaneously out away from axis 32.

Figure 6:
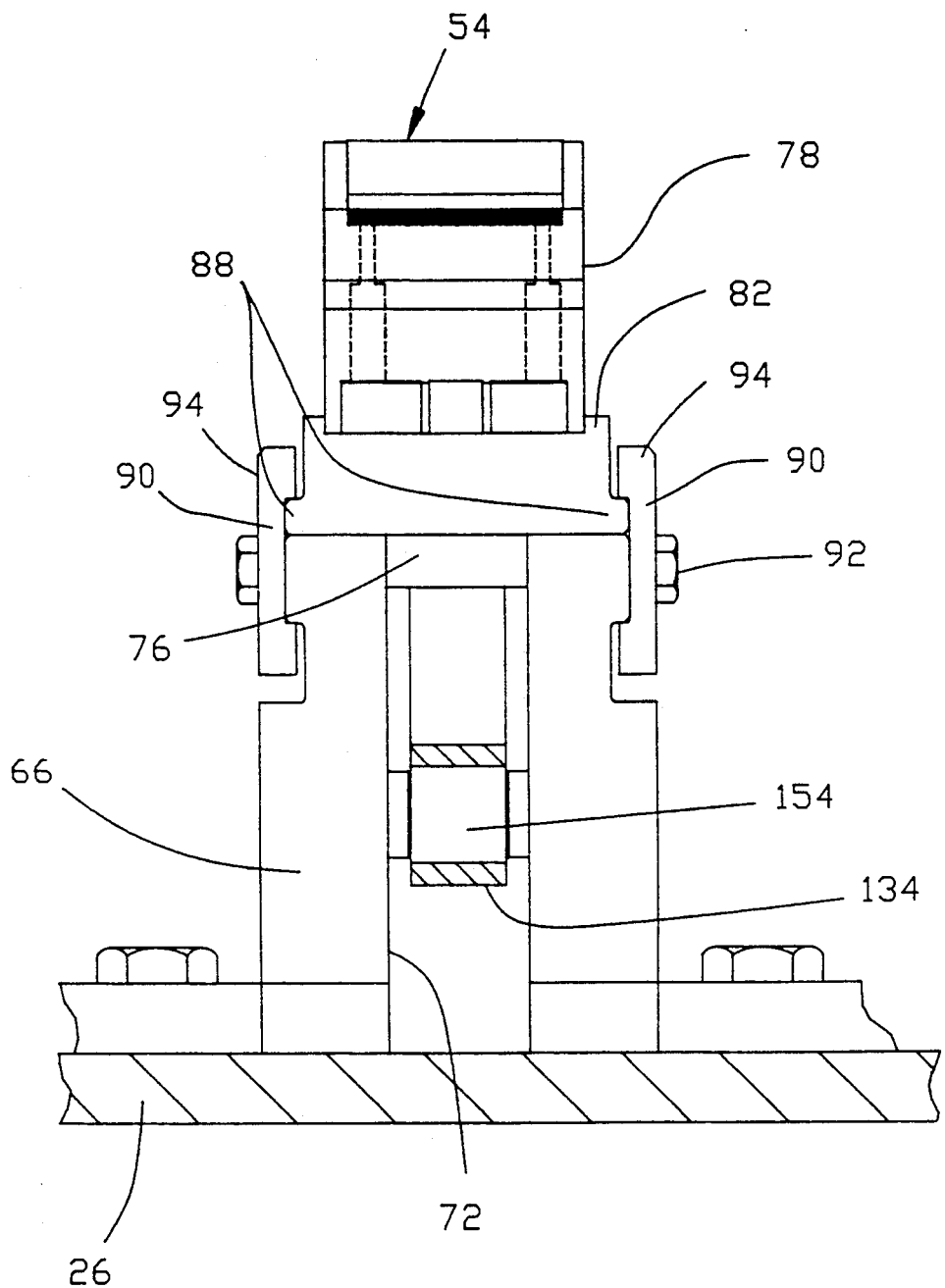
FIG. 6 is a sectional view taken generally along line 6—6 of FIG. 5.
Figure 7:
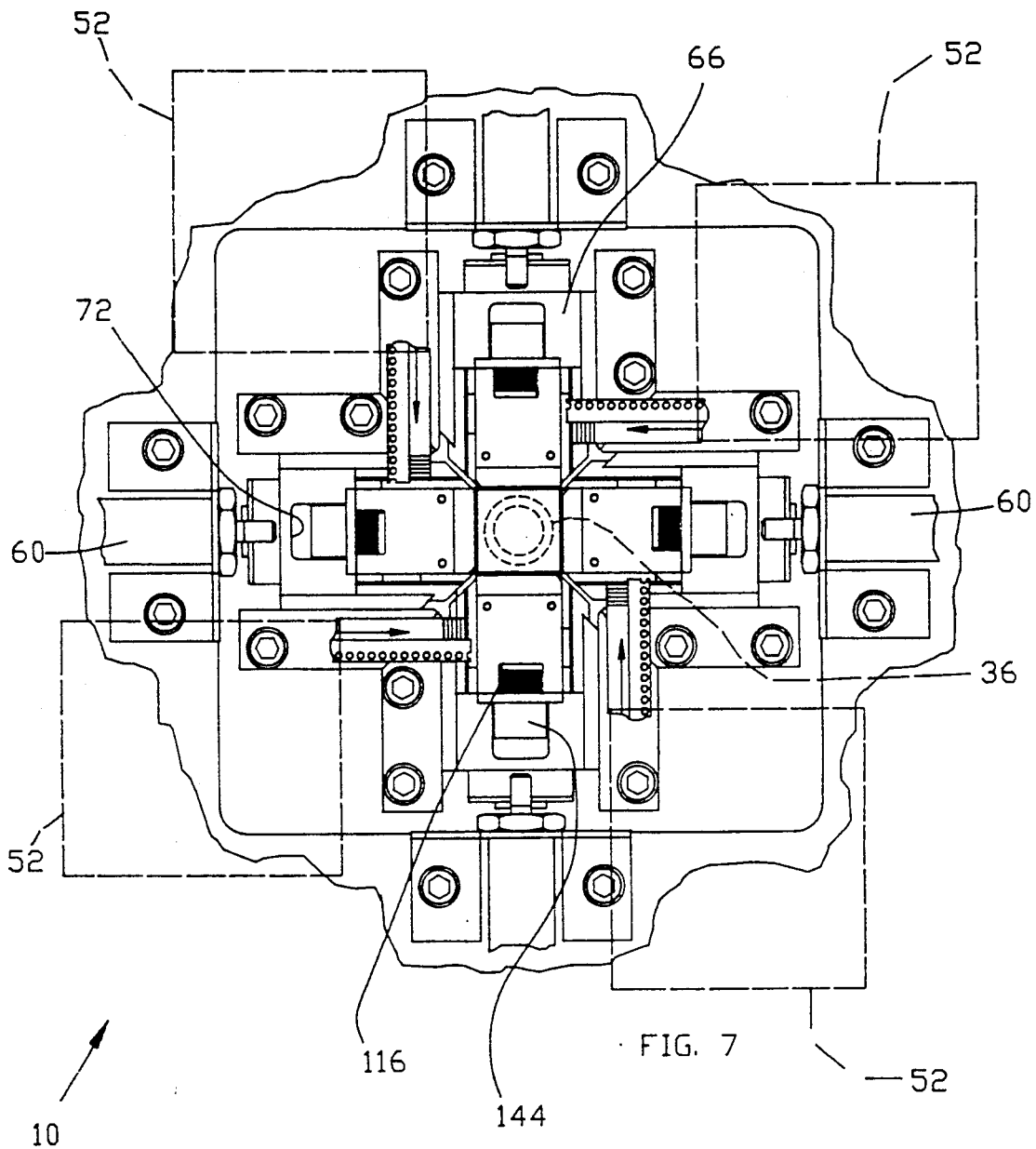
FIG. 7 is a top view like FIG. 1 showing a third position.
Figure 8:
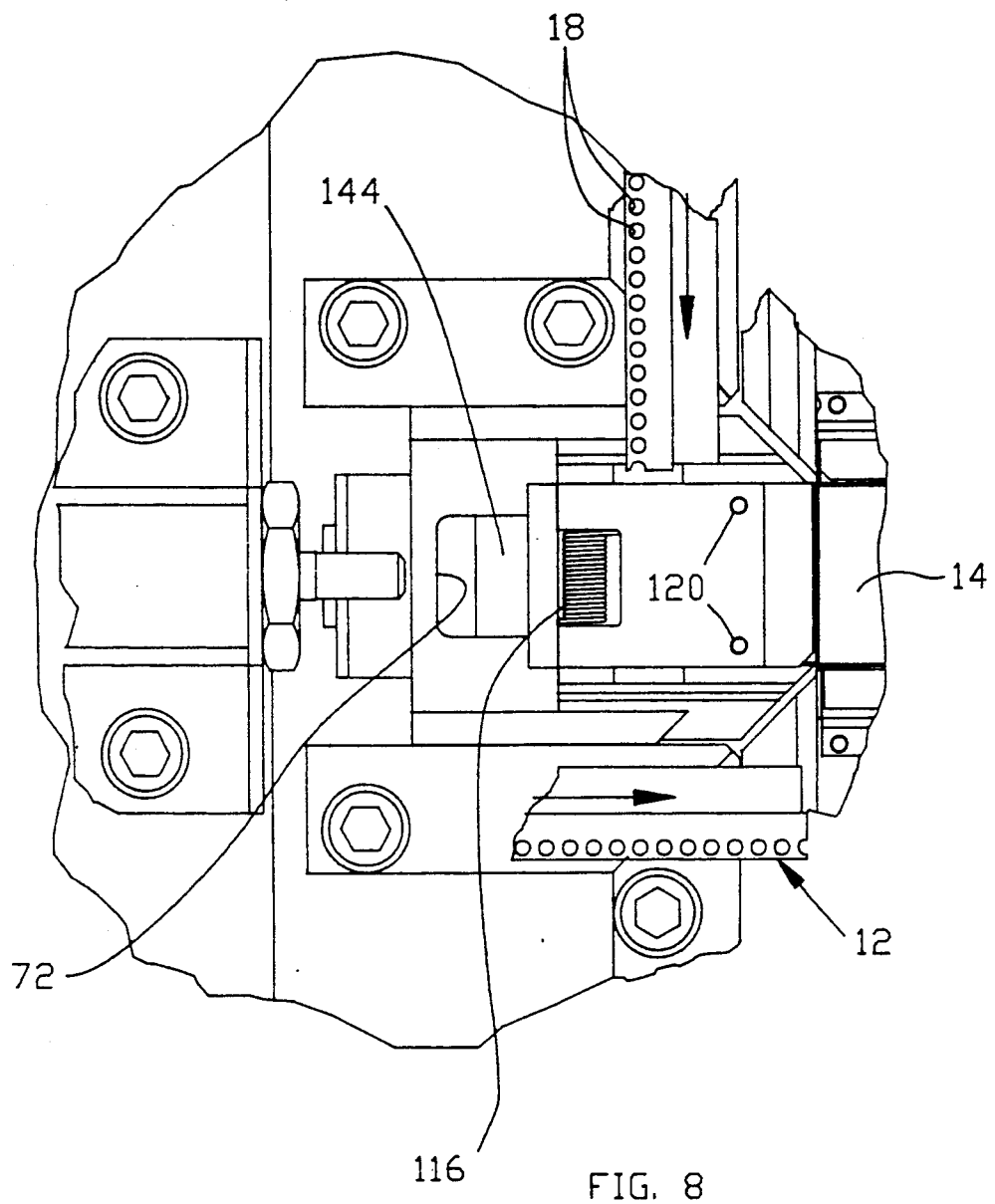
FIG. 8 is an enlarged view of a portion of FIG. 7.

Each mounting assembly 40, 42, 44, and 46 is identical so that as the description proceeds, only one mounting assembly will be described. The lead strip transport head 48 of each mounting assembly is slidably mounted on the top of an alignment block 66 for movement toward and away from axis 32. The alignment block is adjustably secured to base plate 26 by conventional fixturing 68. A slot 72 is formed in the alignment block under each assembly. Stop rod 76 extends between the sidewalls of the slot near the top front of the alignment block. Gib plates 90 are mounted to the sides of each alignment block 66 by a bolt connection 92 so that gibs 94 extend over flanges 88 on head 48 to permit movement of the head toward and away from axis 32. See FIG. 6.

The fixturing permits adjustment of the location of the alignment blocks on the top of the baseplate to permit use of machine 10 for mounting leads on different size square and rectangular substrates.

Figure 4:
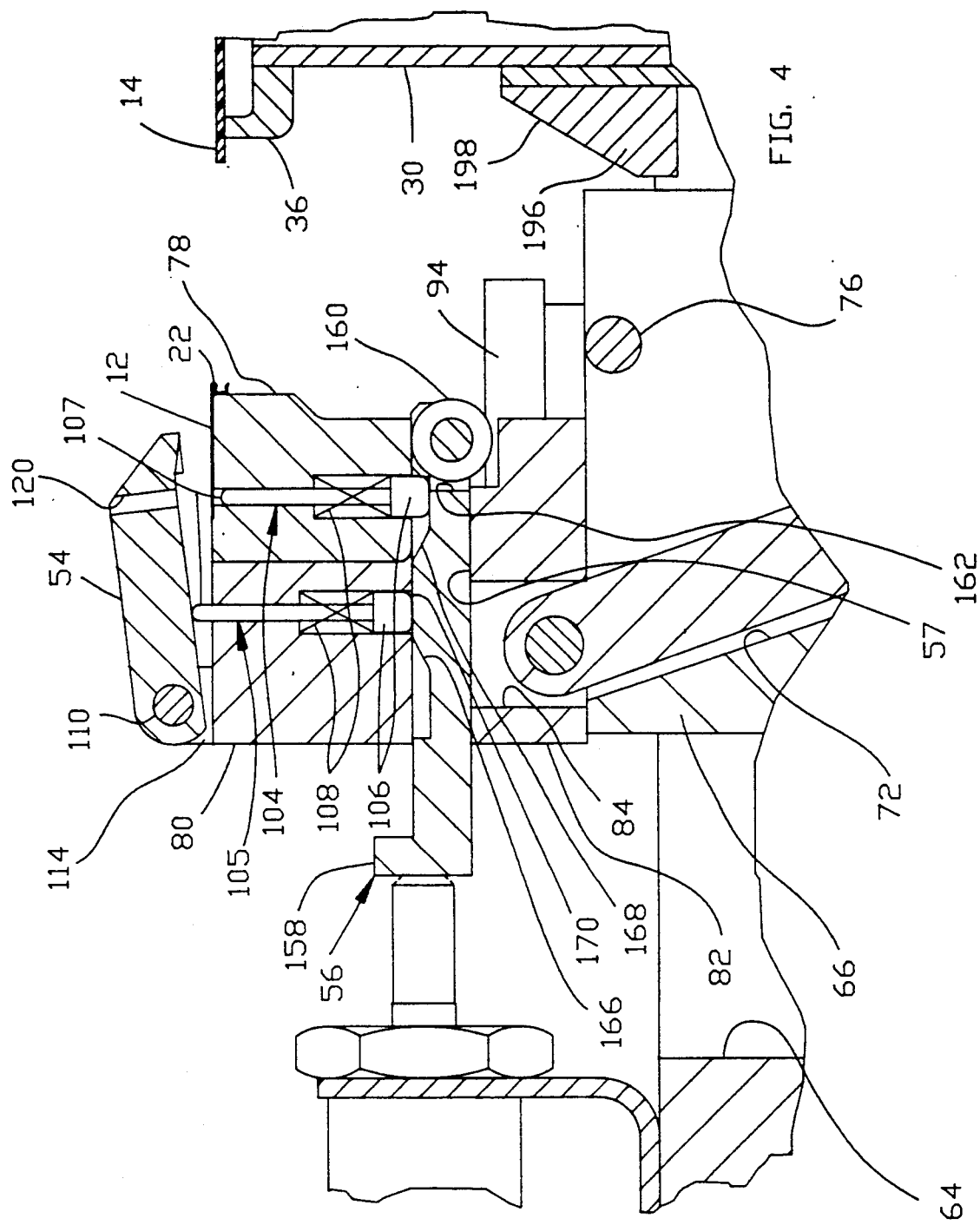
FIG. 4 is an enlarged view, partially broken away, of one of the assemblies shown FIG. 3.

As shown in FIG. 4, lead strip transport head 48 includes front block 78, rear block 80 and slide base 82 located below the front and rear blocks and slidable on top of alignment block 66. The front and rear blocks are joined to the slide base by bolt connections (not shown) so that the front and rear blocks and slide base move as a single unit. Blocks 78 and 80 and base 82 define slot 57. Slot 84 extends through the thickness of slide base 82 above slot 72. Flanges 88 are located on opposite sides of base 82. The rear block 80 includes a pair of spaced support ears 114 extending up from the back sides of the block. Rod 110 extends between the ears.

Front and rear blocks each include a pair of aligned parallel counterbore passageways 96 and 98, respectively. Each passageway extends vertically through a block from the bottom to the top of the block and includes a lower wide portion 100 and a narrow upper portion 102.

An elongate pin member 104 is slidable within each passageway 96 and elongate pin member 105 is slidably fitted in each passageway 98. Each pin member includes a lower wide pin head 106 and a narrow pin 107. The pin heads are fitted in wide portions 100 of passageways 96 and 98 and the pins 107 are fitted in narrow portions 102. Each pin head is biased down against slide cam 56 by a coil spring 108 located within the wide portion of the passageway between the pin head and the closed end of the wide portion in each passageway.

Clamp plate 54 on the top of transport head 48 is rotatably mounted on shaft 110. A torsion spring 116 biases the clamp plate downward against the tops of the front and rear blocks. Torsion spring 116 surrounds shaft 110 and is confined in clamp plate cut out 118.

Viewing holes 120 extend vertically through the clamp plate. The viewing holes align with the narrow portion of counterbore passageways 96 in front block 78 when the lid is in the clamping position shown in FIG. 10. The viewing holes allow a machine operator to quickly determine whether pins 104 have extended into the pilot holes 18 in the lead strip segment held in the head.

The transport heads 48 are moved toward and away from central axis 32 by drive 50. The drive includes drive cylinder 122 stationarily mounted to the bottom of base plate 26 by support members 124. The cylinder surrounds axis 32 and includes upper air inlet 126, lower air inlet 128 and a piston 130 slidable within the cylinder between the air inlets. Piston 130 is connected to vertically movable hollow outside tube 132 which surrounds fixed vacuum tube 30. The outside tube 132 extends through aligned holes in the top and bottom of cylinder 122 and through an opening in base plate 26 as shown in FIG. 3. Air is intermittently flowed from a source of pressurized air (not shown) into and out from the upper and lower air inlets. Cam 134 is secured to the upper end of tube 132 for vertical movement with the tube. The cam has a hub 136 and four C-shaped yokes 138 integral with the hub portion and equally spaced 90 degrees apart around the hub. Each yoke portion extends partially into the adjacent block slot 72.

Drive 50 also includes four angled levers 144 with integral lever arms 146 and 148. Each lever 144 is located within a slot 72 and is rotatably mounted on a pin 150 which extends between the slot sidewalls. Cam rollers 154 are mounted on the free ends of arms 146 and 148. The free end of each arm 146 extends into an adjacent yoke 138. The free end of each arm 148 extends into a slot 84 in slide base 82. Down and up vertical movement of hub 136 moves the four heads 48 toward and away from axis 32.

The slide cam 56 is slidable in slot 57. The slide cam includes integral flange 158 which extends upward, perpendicular the cam at the rear of the cam and a rotary follower 160 mounted in cut out 162 at the front of cam. As shown in FIG. 1, the front corners of the cam are tapered inwardly. The inward taper permits each cam to move toward the central axis 32 without interfering with the inward movement of the other two adjacent cams.

The cam 56 includes a pair of cam recesses 166 and 168 which are separated by a raised dwell surface 170. See FIG. 4. A pair of recesses and a raised dwell surface extend adjacent each longitudinal edge of the slide cam below each pair of longitudinally aligned passageways 96 and 98. Each recess is located below each pair of pin members 104 and 105. Each pin head slidably engages a cam recess or the raised dwell surface 170, depending upon the position of the cam.

Drive 58 moves the slide cams away from axis 32. The drive includes inside axial tube 182 located between the outside tube 132 and vacuum tube 30 and vertically movable along central axis 32. The inside tube is longer than the outside tube and extends beyond the ends of the outside tube. The piston 190 of cylinder 184, like cylinder 122, is connected to the lower end of tube 132. The cylinder 184 is joined to the bottom of support plate 192. The support plate is mounted on plate 26 by supports 194. The cylinder has upper air inlet 186 and lower air inlet 188 to either side of a piston 190. Conical cam 196 is secured to the upper end of tube 182 above the contact cam 134. The conical cam has an outwardly tapered annular cam surface 198.

A conventional computer controller (not shown) governs the flow of air to cylinders 122 and 184, cylinders 60, the vacuum supplied to the vacuum tube, the operation of the cut and feed assemblies 52 and the operation of the pick and place device. The controller is pre-programmed so that each component of machine 10 operates at the required time during a cycle of operation.

The operation of the lead strip mounting machine will now be described.

Substrate 14 is placed onto support pad 36 by pick and place unit so that each substrate edge faces a mounting assembly 40, 42, 44 or 46. The pick and place unit is retracted and the computer controller shifts a valve to connect the vacuum source 38 to pad 36 through tube 30, thereby holding the substrate on the top edge of the pad 36. See FIG. 3.

The mounting assemblies, slide cams, clamp plates and cut and feed assemblies each operate identically so that only the operation of one need be described.

Figures 13, 14:
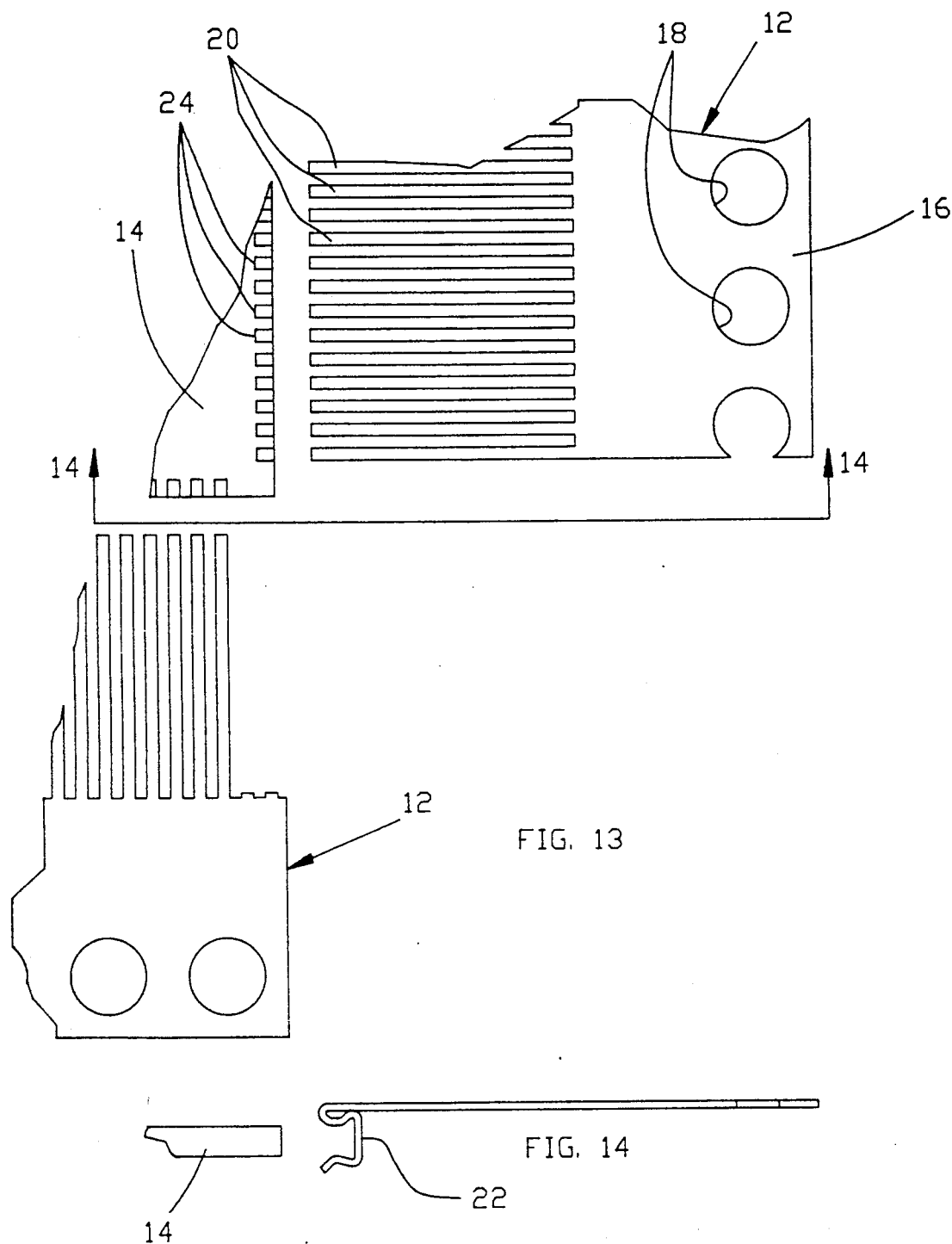
FIG. 13 is a top view, partially broken away, showing lead strip segments adjacent the edges of a substrate prior to mounting the clip ends of the leads onto the edges of the substrate.
FIG. 14 is a sectional view taken along line 14—14 of FIG. 13.

The transport head, slide cam and clamp plate are in a lead strip-receiving first position shown in FIGS. 1-4. In this position, the transport heads are located away from the adjacent edge of the substrate 14 and adjacent a strip feed and cut off assembly 52. The slide cam is retracted away from axis 32 so that the rear pin members engage rise surface 170 and hold clamp plate 54 in an open position. A lead strip segment 12 of the desired length cut from the lead strip by the lead strip feed and cut off assembly 52 is positioned on the top of front block 78 with the leads approximately aligned with the substrate pads along the adjacent edge of the ceramic substrate. As shown in FIG. 13, the two leads adjacent the leading edge of the lead strip segment are cut from the carrier strip. This permits the lead strip to be mounted onto the substrate edge without interfering with adjacent lead strips.

As shown in FIGS. 3 and 4, the strip segments 12 have been fed onto block 78 with clips 22 engaging the front of the block to maintain the lead segments 12 straight along the top of the front block. Piston 190 of drive 58 is located at the bottom of its stroke and the piston 130 of drive 50 is located at the top of its stroke when machine 10 is in the first position.

Figure 5:
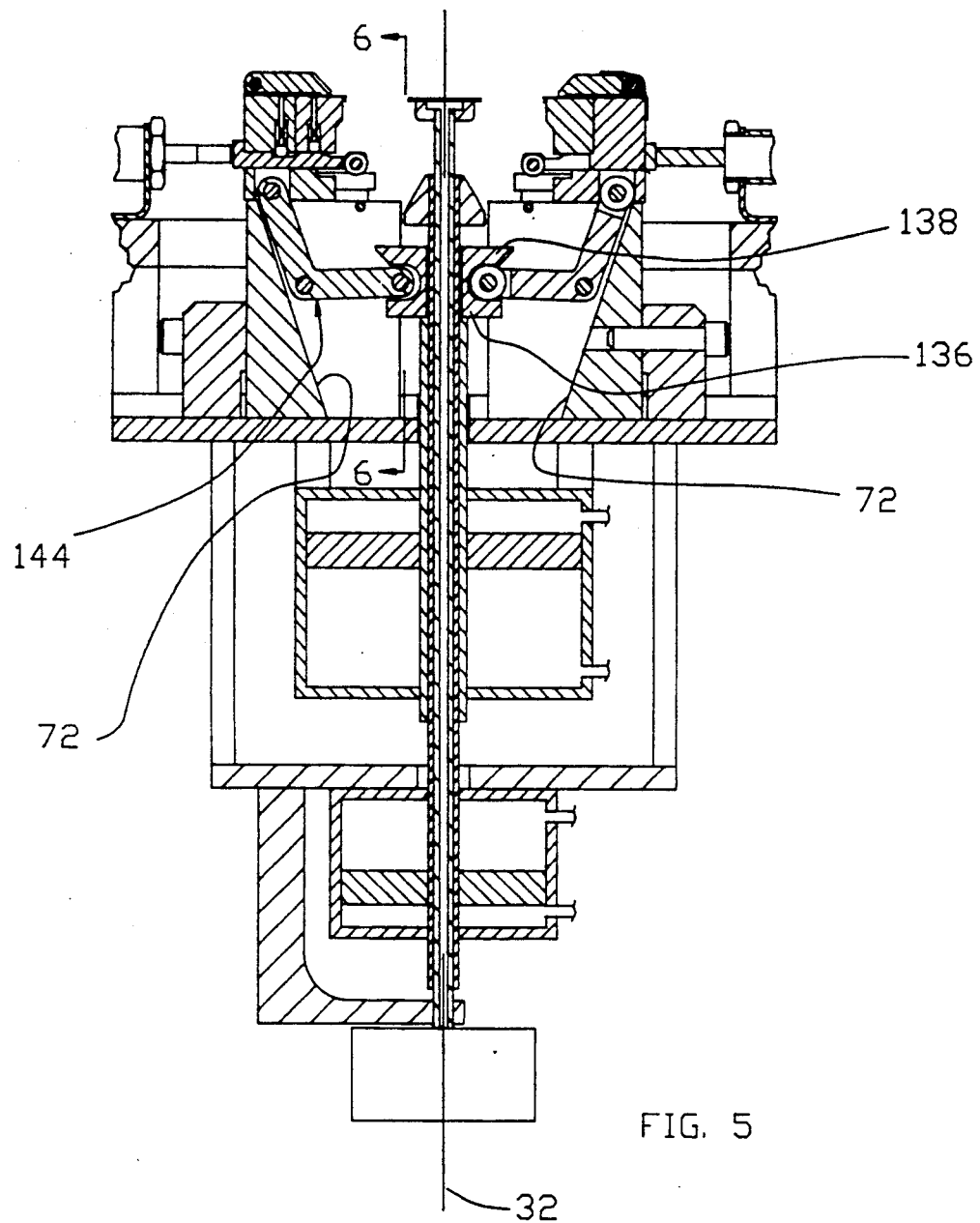
FIG. 5 is a sectional view like FIG. 3 which shows a second position.

After lead strip segments are placed on the top of front blocks 78 below clamping plates 54, the slide cams and clamping plates are moved to a second position. Cylinders 60 are extended to extend the actuator piston rods 61, causing the rods to contact flanges 158 of slide cams 56, moving the slide cam inward toward the central axis 32. As the slide cam moves inward from the position of FIG. 4 to the position of FIG. 5 pin members 105 are retracted to lower the clamp plate and clamp the lead strip segments against blocks 78 and pin members 104 are raised to extend pin members 104 into pilot holes 18 in the segments for accurate location of the segments on the blocks. After piston rods 61 are fully extended, air supplied to cylinders 60 is reversed to retract the piston rods to the position of FIG. 4.

Figure 9:
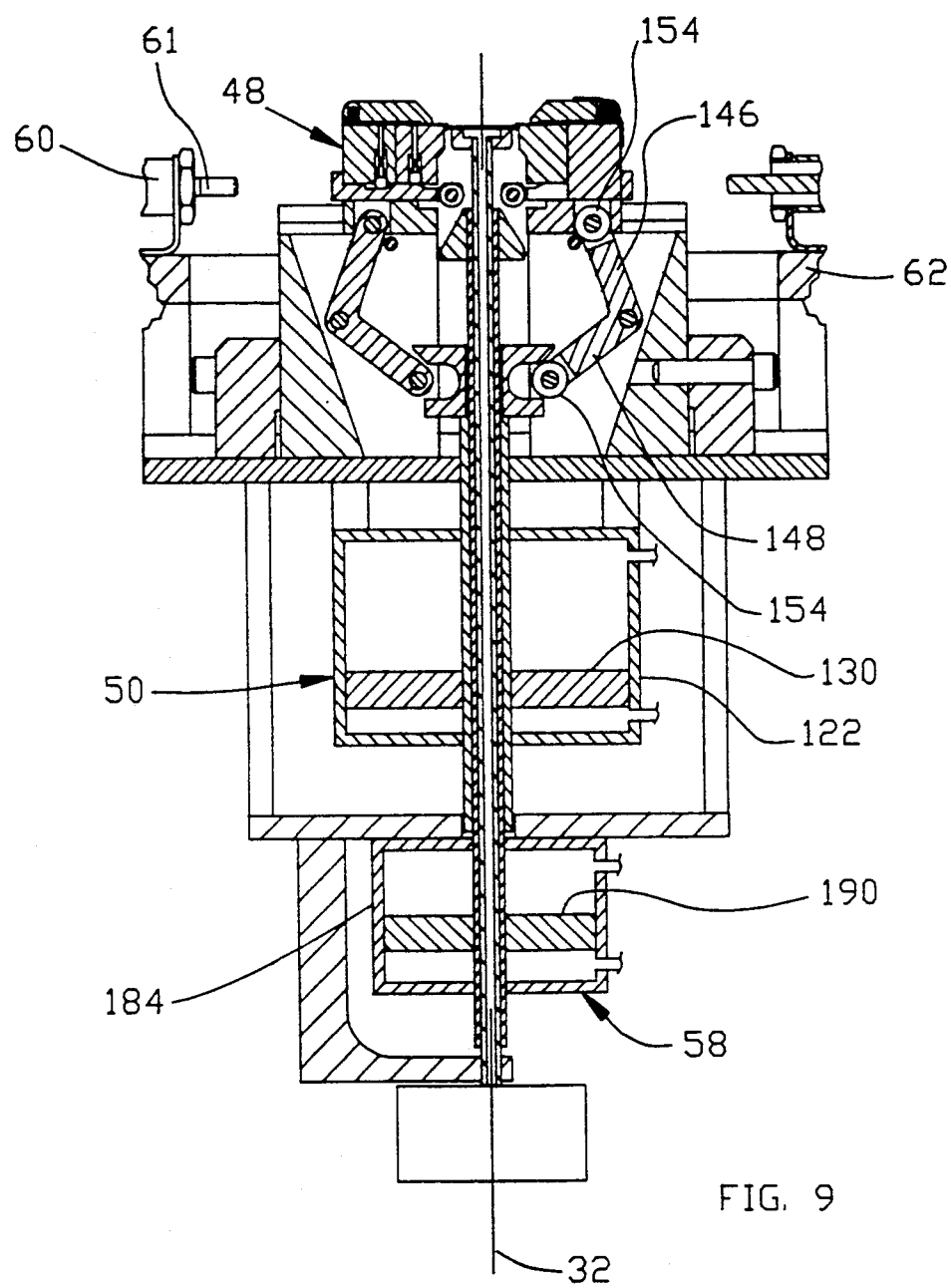
FIG. 9 is a sectional view like FIG. 3 showing the assemblies in the third position.
Figure 10:
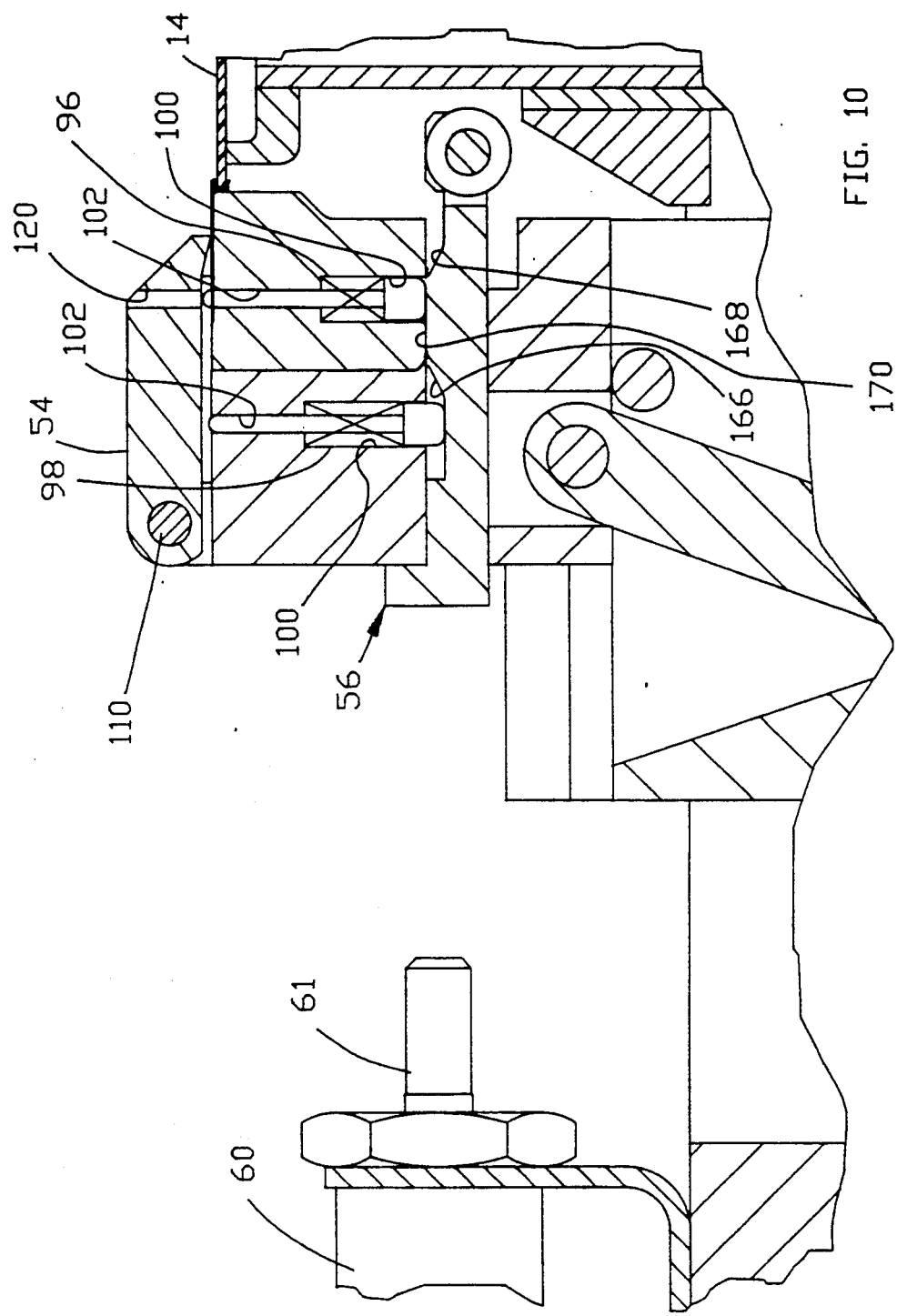
FIG. 10 is an enlarged view, partially broken away, of one of the transport heads of FIG. 9.
Figure 15:
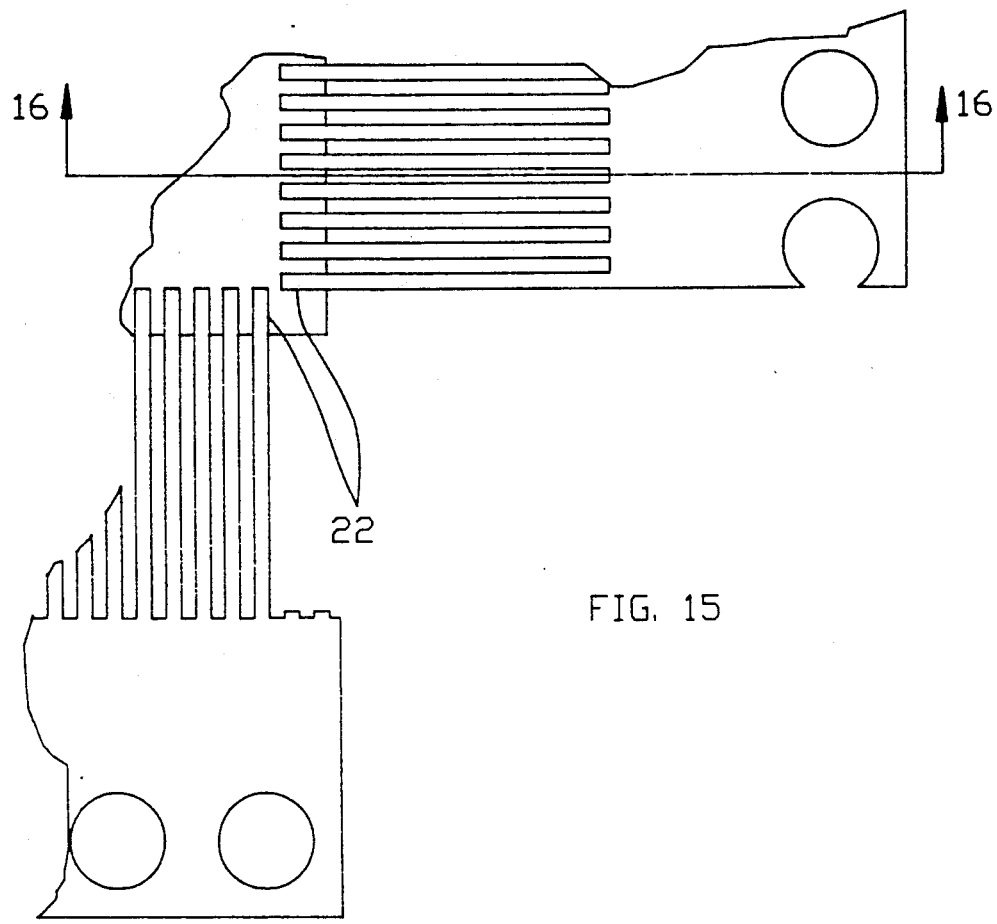
FIG. 15 is a top view like FIG. 13, showing the lead strips mounted onto the edges of the substrate.
Figure 16:
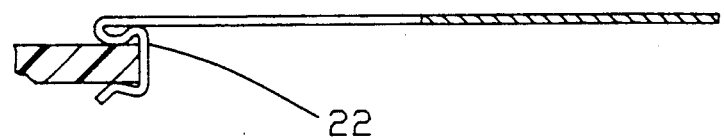
FIG. 16 is a sectional view taken along line 16—16 of FIG. 15.

The mounting assembly and held lead strip segment are next moved to a third position shown in FIGS. 9 and 10 by drive 50. Pressurized air is flowed into the air inlet 126 of the cylinder 122 to move piston 130 down, causing outside tube 132 and cam 134 to move down. This downward movement rotates levers 144 and moves the mounting assemblies toward central axis 32 and substrate 14. The downward bias of the pin members on the slide cams maintains the slide cams stationary on the slide bases so that the slide cams move with the assemblies. The levers rotate until arms 148 contact stop 76. The stops are precisely located so that as the arms contact the stops, the clips 22 of each lead strip segment are seated on the adjacent edge of substrate 14 with each clip in contact with a contact pad on the substrate. See FIGS. 15 and 16. The leads are mounted on each side of the substrate in synchronization. The clip end of each lead is force fitted onto the edge of the substrate.

Figure 11:
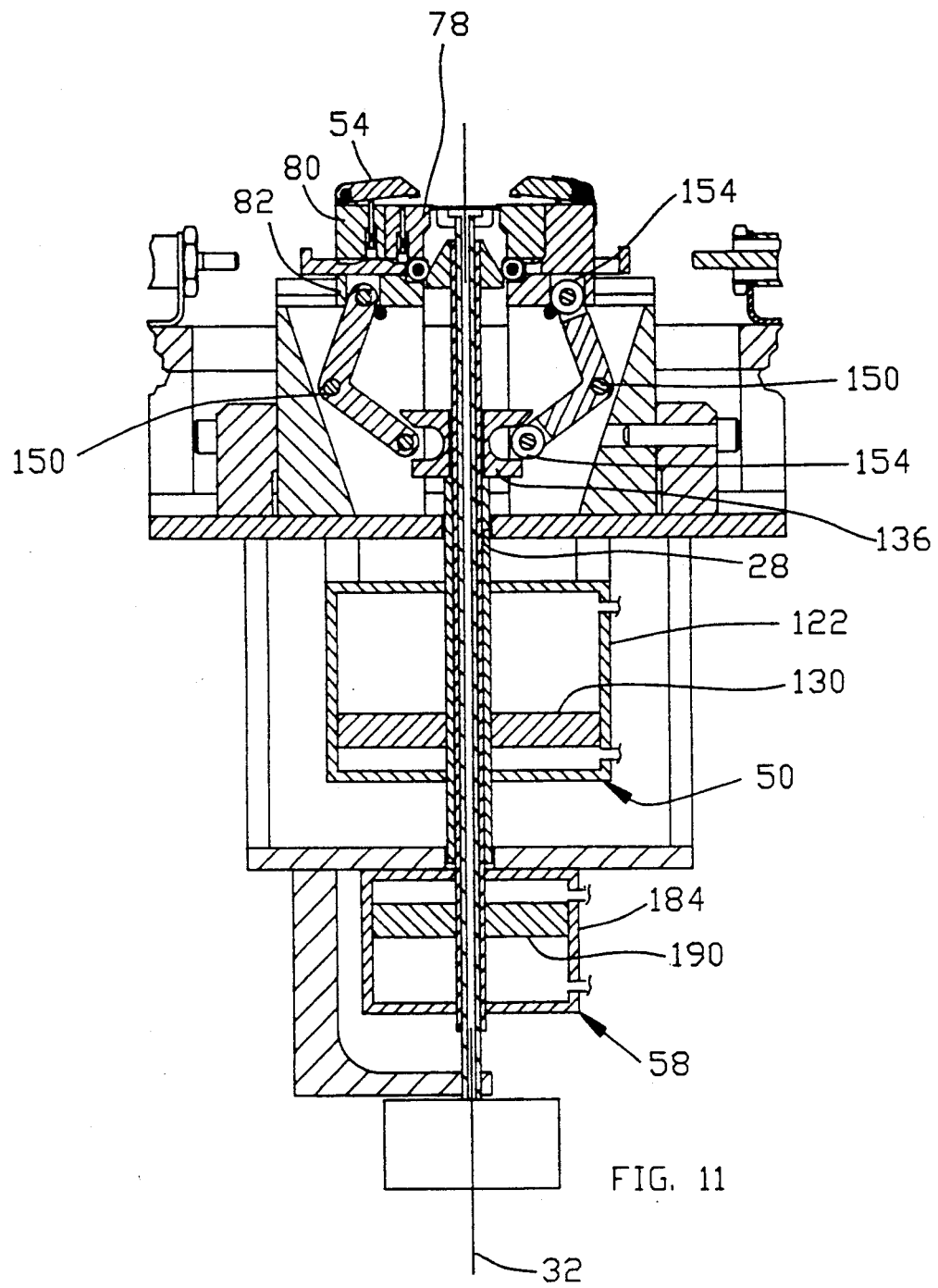
FIGS. 11 and 12 are sectional views like FIG. 3 which show fourth and fifth positions respectively of the mounting machine.

After the leads have been mounted on each edge of the substrate, the clamping plate and slide cam are moved to a fourth position shown in FIG. 11.

Cylinder 184 is actuated to raise piston 190 and move the inner tube 182 and conical cam 196 vertically upward along central axis 32. As the conical cam moves up, cam surface engages slide cam followers 160 and pushes all four cams 56 away from axis 32. During outward displacement of the slide cams, the transport heads remain stationary. The slide cams are forced outwardly simultaneously.

As each slide cam moves outward, pin members 105 are raised and pin members 104 are lowered, thereby raising the clamp plates 54 and freeing the lead strip segments already mounted on the substrate 14.

Figure 12:
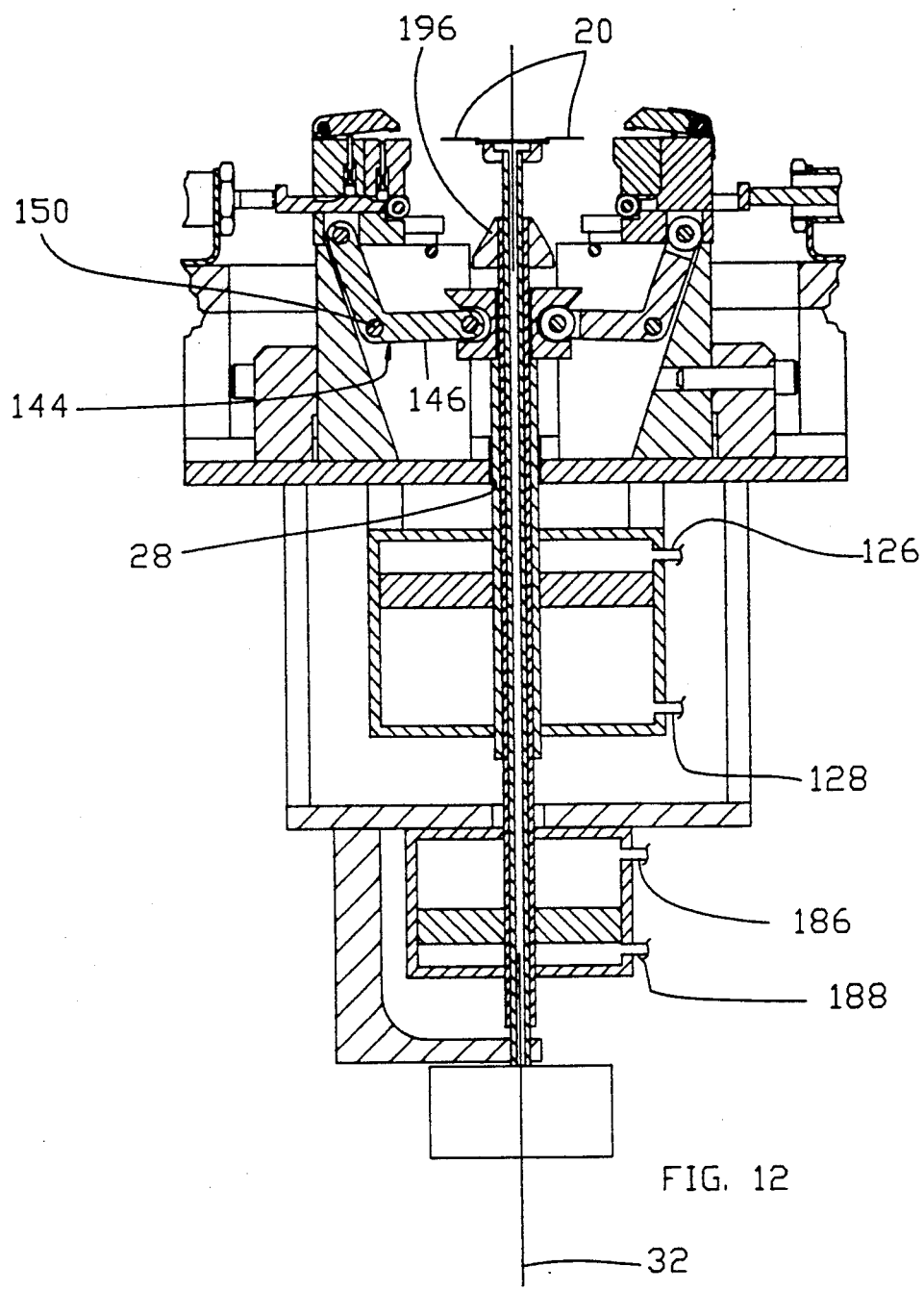

The transport head, slide cam and clamping plate are next moved to a fifth position shown in FIG. 12. Drive 50 is actuated to raise piston 130, tube 122 and cam 134. As the hub moves up arms 144 are rotated to retract the transport heads 48 away from the central position of FIG. 11. The mounting assemblies move away from the lead strip segments mounted on substrate 14. The piston 130 moves up until the transport heads are returned adjacent the strip cut and feed assemblies 52. Assemblies 52 then feed the lead ends of lead strips onto the transport heads 48 under the raised clamp plates and sever the fed segments from the remainder of the carrier strip. In this position, machine 10 has completed a complete cycle of operation and returned to position 1, as previously described.

The controller then sends a signal to the vacuum supply terminating the vacuum supplied to support pad 36 and the pick and place device removes the substrate with the mounted strip segment from the support pad. The substrate is moved to a soldering station where the clips are soldered to the substrate pads.

The machine 10 operating as described can mount lead strip segments on the four sides as many as 900 substrates per hour. If this high production rate is not required, the number of strip feed and cut off assemblies 52 may be reduced. If only one or two assemblies 52 are included in machine 10, the leads are inserted respectively onto one or two transport heads as previously described. Then base plate 28 is rotated, to align the empty transport head or heads with an assembly 52. After lead strip segments are simultaneously inserted onto each empty transport head, the lead strips are mounted onto the edges of the substrate as previously described.

Mounting machine 10 may be used to mount flat leads 220 onto the edges of substrate 14. See FIGS. 17-19. When the machine is used to mount flat leads onto the substrate, the vacuum tube 30 is vertically movable within inside tube 182 by a substrate support cylinder and piston arrangement (not shown) like cylinders 122 and 184. Operation of the machine includes each of the operative steps previously described. Additionally, after a substrate is accurately located on substrate support pad 36, the vacuum tube and pad supporting the substrate are moved down a short distance by the substrate support cylinder. When the transport heads move the flat lead strips to the mounting position, the end of each lead is in vertical alignment with and above a pad on the substrate. See FIG. 17. The substrate support cylinder is actuated to raise the support pad and move the substrate vertically up until the end of each lead engages the substrate pad vertically aligned with the lead as shown in FIG. 19. The leads, which are solder coated, are then heated and reflow soldered to the substrate pads in a conventional fashion. The leads are supported by the transport heads during soldering. The soldered leads are shown in FIG. 19. After soldering, the heads are opened and retracted and the cycle of operation is completed, as previously described.

While we have illustrated and described a preferred embodiment of our invention, it is understood that this is capable of modification, and we therefore do not wish to be limited to the precise details set forth, but desire to avail ourselves of such changes and alterations as fall within the purview of the following claims.

What we claim as our invention is:

1. Apparatus for simultaneously mounting lead strip segments of the type having a carrier strip and a plurality of leads extending from one side of the carrier strip to contact portions on the free ends of the leads on the edges of rectangular integrated circuit substrates with the contact portions of the leads engaging contact pads spaced along the edges of the substrates, the apparatus including,
   a) an integrated circuit substrate support located on a central axis;
   b) a plurality of transport assemblies spaced around the central axis with each transport assembly located outwardly of the substrate support, each transport assembly including a transport head movable between a loading position away from the axis and a mounting position adjacent the axis, lead strip segment clamp means for securing a lead strip segment to the head at a location facing the axis for mounting on the edge of an integrated circuit substrate on the substrate support;
   c) lead strip segment feed means for feeding a lead strip segment to each transport head when in the loading position;
   d) a transport head drive for moving said transport heads simultaneously between said loading position and said mounting position, said transport head drive including an extendable and retractable first drive member, first drive means for extending and retracting the first drive member and first operative connections joining the first drive member and each transport head; and
   e) clamp drive means for releasing the clamp means in each transport assembly simultaneously when the transport heads are in the mounting position.

2. Apparatus as in claim 1 wherein said substrate support means includes a vacuum recess, and including a vacuum source and a vacuum line communicating said source and the vacuum recess.

3. Apparatus as in claim 2 wherein said vacuum line includes a first tube extending along said axis.

4. Apparatus as in claim 3 wherein said first drive member is adjacent and movable along said axis.

5. Apparatus as in claim 4 wherein said first drive means comprises a fluid cylinder on said axis, said vacuum line extending through said fluid cylinder; and said first drive member comprises a second tube surrounding said first tube.

6. Apparatus as in claim 1 wherein said first drive member is movable along the axis and each first operative connection mechanically joins the first drive member and a transport assembly.

7. Apparatus as in claim 6 wherein said first drive means comprises a fluid cylinder mounted on said axis, said cylinder including a piston movable along the axis and wherein said first drive member is connected to the piston.

8. Apparatus as in claim 7 wherein each operative connection comprises a connection member pivotedly connected to the first drive member and a transfer head.

9. Apparatus as in claim 8 wherein each connection member is pivotedly connected to the apparatus.

10. Apparatus as in claim 9 wherein each connection member is pivotedly connected to the apparatus between the connections to the drive member and transfer head.

11. Apparatus as in claim 8 including four transport assemblies arranged 90 degrees apart around the axis.

12. Apparatus as in claim 11 including four lead strip feed and cut-off assemblies arranged 90 degrees apart around the axis, each such assembly being associated with one of said transport assemblies and located between two adjacent transport assemblies.

13. Apparatus as in claim 1 wherein said clamp drive means includes an extendable and retractable second drive member, second drive means for extending and retracting the second drive member, and second operative connections joining said second drive member and each clamp means.

14. Apparatus as in claim 13 wherein said first drive member and said second drive member are movable along the axis.

15. Apparatus as in claim 14 wherein each first operative connection mechanically joins said first drive member and a transport head and each second operative connection mechanically joins the second drive member and each clamp means.

16. Apparatus as in claim 15 wherein said first head drive means includes a first tube surrounding the axis and second drive means includes a second tube surrounding said axis.

17. Apparatus as in claim 16 wherein said first drive means includes a first fluid cylinder on said axis connected to said first tube and said second drive means includes a second fluid cylinder on said axis connected to said second tube, one of said tubes extending through one of said cylinders.

18. Apparatus as in claim 1 wherein each transport assembly includes means for aligning a lead strip segment on the transport head with the free ends of the leads in alignment for engagement with contact pads on the edge of a substrate held on the substrate support.

19. Apparatus as in claim 18 wherein the clamp means comprises a clamp hingeably mounted to the transport head, a spring biasing the clamp against the head to hold a lead strip segment in place on the head, and the clamp drive means includes a lift member movably mounted on the head, and a lift member drive for shifting the lift member to engage the clamp and rotate the clamp away from the transport head.

20. Apparatus as in claim 1 including a cam slidably mounted on each transport head, a lift member movably mounted on each transport head and engagable with the cam for movement between extended and retracted positions in response to shifting of the cam, a first fluid cylinder associated with each transport assembly engagable with the cam in the head of such assembly for shifting the cam in one direction, a second fluid cylinder and a plurality of operative connections joining said second fluid cylinder and the cams in said heads for shifting said cams in a direction opposite said one direction.

21. Apparatus as in claim 20 wherein said second fluid cylinder is located on said axis.

22. Apparatus as in claim 20 wherein said substrate support includes an elongate member extending along said axis through said second fluid cylinder.

23. Apparatus as in claim 1 wherein each transport head includes a lead strip alignment member engagable with a lead strip segment held on the head by the clamp means to align such segment for mounting on the edge of a substrate held on the substrate support.

24. Apparatus as in claim 23 wherein said alignment member comprises a pin extendable into a pilot hole formed in the carrier strip of a lead strip segment held on the head by the clamp means and a pin drive for extending and retracting the pin.

25. Apparatus as in claim 1 wherein said first drive means and said clamp drive means are located on said axis.

26. Apparatus as in claim 25 wherein said first drive means is located between the substrate support and said clamp drive means.

27. Apparatus as in claim 1 wherein the integrated circuit support member extends past said first drive means.

28. Apparatus as in claim 27 wherein said support member comprises a vacuum tube.

29. Apparatus for simultaneously mounting a plurality of contact leads on the edges of integrated circuit substrates with the contact portions of the leads engaging contact pads spaced along the edges of the substrates, the apparatus including,
   a) an integrated circuit substrate support located on a central axis;
   b) a plurality of transport assemblies spaced around the central axis with each transport assembly located outwardly of the substrate support, each transport assembly including a transport head movable between a loading position away from the axis and a mounting position adjacent the axis, first means for securing a plurality of contact leads to each head at a location facing the axis for mounting on the edge of an integrated circuit substrate on the substrate support;
   c) second means for feeding leads to each transport head when in the loading position; and
   d) a transport head drive for moving said transport heads between said loading position and said mounting position, said transport head drive including a first drive member, third means for moving the first drive member and first operative connections joining the first drive member and said transport heads.

30. Apparatus as in claim 29 wherein said substrate support means includes a vacuum recess, and including a vacuum source and a vacuum line communicating said source and the vacuum recess.

31. Apparatus as in claim 30 wherein said third means comprises a fluid cylinder on said axis, said vacuum line extending through said fluid cylinder; and said first drive member comprises a second tube surrounding said first tube.

32. Apparatus as in claim 29 wherein said third means comprises a first fluid cylinder mounted on said axis, said cylinder including a piston movable along the axis and said first drive member is mounted on said axis and connected to the piston.

33. Apparatus as in claim 32 including fourth means for releasing the contact leads from the transport heads, and a release drive for the fourth means comprising a second fluid cylinder mounted on said axis.

34. Apparatus as in claim 33 wherein sad operative connections each include a plurality of arms each joining the first drive member and said transport heads.

35. Apparatus as in claim 33 wherein said fourth means includes a cam member movable along said axis and connected to said second cylinder and a follower member on each transfer head engagable with said cam member.

36. The method of mounting lead strip segments on the edges of rectangular integrated circuit substrates, comprising the steps of:
   a) positioning a rectangular integrated circuit substrate on a central substrate support, the substrate having edges with spaced contact pads extending along the edges;
   b) feeding a lead strip segment having free lead ends to each of a plurality of transfer heads spaced around the integrated circuit substrate, the free ends of the leads in such segments extending toward an adjacent edge of the integrated circuit substrate;
   c) clamping each lead strip segment in position on its respective transfer head;
   d) simultaneously moving the transfer heads toward the integrated circuit substrate to position the free ends of the leads in the lead strip segments clamped on the transfer heads over the contact pads on the adjacent edges of the integrated circuit substrate;
   e) forming physical connections between the lead ends and the contact pads on the substrates; and
   f) releasing the lead strip segments from the transfer heads.

37. The method of claim 36 including the step of,
   g) clipping the ends of the leads to opposite sides of the substrate in physical contact with contact pads.

38. The method of claim 36 including the step of,
   g) soldering the lead ends to contact pads on the substrate.

39. The method of claim 38 including performing step f) before step g).

40. The method of claim 38 including performing step before step f).

41. The method of claim 36 including the step of,
   g) positioning the ends of the leads directly over the pads and then moving the ends of the leads and the pads into contact.

42. An apparatus for simultaneously mounting lead strip segments onto at least two edges of an integrated circuit substrate having a plurality of spaced contact pads spaced along the edges of the substrate with the contact portions of the leads engaging the contact pads, the apparatus comprising:
   a) an integrated circuit substrate support located on a fixed axis;
   b) a lead strip insertion means for simultaneously mounting leads onto each edge of an integrated circuit substrate located on the substrate support, each said means movable between a mounting position adjacent the support and a receiving position remote from the support;
   c) a lead strip supply mechanism for supplying lead strip segments to the insertion means when the insertion means is in said receiving position; and
   d) a drive for moving the insertion means between said receiving and mounting positions, said drive including a first drive member movable along said axis and operative connections joining said drive member and each said insertion means.

43. An apparatus as in claim 42 wherein said lead strip insertion means comprises a plurality of transport assemblies spaced around the fixed axis, each assembly having a transport head movable between said positions in synchronization with the other transport heads.

44. An apparatus as in claim 43 wherein there are four transport assemblies spaced 90 degrees apart around the fixed axis.

45. An apparatus as in claim 43 wherein each transport assembly includes a clamp for maintaining the lead strip on the transport head during movement of the head to the mounting position, said clamp being movable between an open position when the transport head is in the receiving position and a clamping position when the transport head is moved away from the receiving position.

46. The method of mounting a plurality of leads onto the edges of integrated circuit substrates having spaced opposed sides joined by edges and contact pads along the edges, said method comprising the steps of:
   a) positioning an integrated circuit substrate on a substrate support located along the fixed axis;
   b) feeding a plurality of spaced leads to each of a plurality of transport heads spaced around the fixed axis with each transport head adjacent a respective edge of the substrate and with lead contact ends of the leads facing the adjacent edge of the substrate;
   c) simultaneously moving each transport head toward its respective substrate edge to position the free ends of the leads above the edges of the substrate.
   d) relatively moving the substrate and leads to bring the ends of the leads into contact with the pads on the edges of the substrate; and
   e) forming electrical connections between the contact pads and the ends of the leads.

47. The method of claim 46 including the step of positioning the substrate below the free ends of the leads before moving the transport heads toward the substrate; and moving the substrate up so that the pads along the edges of the substrate contact the lead contact ends.

48. The method of claim 46 including the steps of clamping each lead strip segment in a position on its respective transfer head and releasing the lead strip segments from the position on its respective transfer head after forming electrical connections between the lead ends and the contact pads.

49. The method of claim 46 including the step of clipping the free ends of the leads onto opposite sides of the substrate as each lead strip is moved toward its respective edge of the substrate.

* * * * *

UNITED STATES PATENT AND TRADEMARK OFFICE
CERTIFICATE OF CORRECTION

PATENT NO. : 5,333,375
DATED : August 2, 1994
INVENTOR(S) : Richard K. Dennis,. et al It is certified that error appears in the above-identified patent and that said Letters Patent is hereby corrected as shown below:

Column 2, line 38, delete "pads" (first occurrence).

Column 4, line 16, change "on to" to --onto--.

Column 12, line 28:
    Claim 40, line 1, after "step", insert --g)--.

Column 13, line 11:
    Claim 46, line 6, before "fixed" change "the" to --a--.

Signed and Sealed this

First Day of November, 1994

Attest:

BRUCE LEHMAN

*Attesting Officer*     *Commissioner of Patents and Trademarks*